United States Patent [19]
Stephani et al.

[11] Patent Number: 6,034,385
[45] Date of Patent: Mar. 7, 2000

[54] CURRENT-LIMITING SEMICONDUCTOR CONFIGURATION

[75] Inventors: Dietrich Stephani, Bubenreuth; Heinz Mitlehner, Uttenreuth; Ulrich Weinert, Herzogenaurach, all of Germany

[73] Assignee: Siemens Aktiengesellschaft, Munich, Germany

[21] Appl. No.: 09/103,168

[22] Filed: Jun. 22, 1998

Related U.S. Application Data

[63] Continuation of application No. PCT/DE96/02347, Dec. 6, 1996.

[30] Foreign Application Priority Data

Dec. 22, 1995 [DE] Germany .......................... 195 48 443

[51] Int. Cl.⁷ .............................. H01L 29/68; H01L 29/80
[52] U.S. Cl. .......................... 257/263; 257/266; 257/287
[58] Field of Search ........................... 257/260, 263–270, 257/287, 280

[56] References Cited

U.S. PATENT DOCUMENTS

| | | |
|---|---|---|
| 4,454,623 | 6/1984 | Hill . |
| 4,737,469 | 4/1988 | Stevens ............................ 257/270 X |
| 5,543,637 | 8/1996 | Baliga . |

FOREIGN PATENT DOCUMENTS

| | | | |
|---|---|---|---|
| 92 860 | 1/1969 | France . | |
| 55-91181 | 7/1980 | Japan ..................... | 257/266 |
| 59-41871 | 3/1984 | Japan ..................... | 257/263 |
| 59-52882 | 3/1984 | Japan ..................... | 257/263 |
| 59-65486 | 4/1984 | Japan ..................... | 257/263 |

OTHER PUBLICATIONS

IEEE Electron Device Letters, vol. EDL–6, No. 6 (Campbell, P.M. et al.), dated Jun. 1985, pp. 304–306.
International Publication WO 95/–7548 (Maier, R. et al.), dated Mar. 16, 1995.
German Utility Model G 94 11 601.6 (Siemens AG), dated Nov. 24, 1994.

*Primary Examiner*—John Guay
*Attorney, Agent, or Firm*—Herbert L. Lerner; Laurence A. Greenberg; Werner H. Stemer

[57] ABSTRACT

A semiconductor configuration includes a first semiconductor region which has a predetermined conductivity type and a first surface. There is a contact region disposed on the first surface of the first semiconductor region. There is a second semiconductor region disposed within the first semiconductor region underneath the contact region which has a conductivity type opposite the predetermined conductivity type of the first semiconductor region. A first p-n junction having a first depletion zone is formed between the first semiconductor region and the second semiconductor region. The second semiconductor region extends further than the contact region in all directions parallel to the first surface of the first semiconductor region to form at least one lateral channel region with a bottom in the first semiconductor region. The at least one lateral channel region is bounded toward its bottom by the first depletion zone of the first p-n junction. In an on state of the semiconductor configuration, the at least one lateral channel region conducts an electric current from the contact region or to the contact region.

10 Claims, 4 Drawing Sheets

6,034,385

CURRENT-LIMITING SEMICONDUCTOR CONFIGURATION

CROSS-REFERENCE TO RELATED APPLICATION

This application is a continuation of International Application Serial No. PCT/DE96/02347, filed Dec. 6, 1996, which designated the United States.

BACKGROUND OF THE INVENTION

FIELD OF THE INVENTION

The invention relates to a semiconductor configuration.

In order to supply an electrical load with a rated electric current, the load is connected to an electrical supply network via a switching device. Overcurrents which are distinctly higher than the rated currents generally occur during the switch-on operation and also in the event of a short circuit. In order to protect the electrical load, the switching device connected between the load and the network must be able to rapidly detect the overcurrents, and in particular short-circuit currents, and to limit them to predetermined values and subsequently to disconnect them. Current-limiting switches are known for this function and are generally formed of mechanical switches or semiconductor switches.

A current-limiting semiconductor switch having a first semiconductor region of a given conductivity type which is assigned respective electrodes at surfaces which are remote from one another is disclosed in non-prosecuted German Patent Application No. 43 30 459 A. Further semiconductor regions of the opposite conductivity type are then disposed, at a distance from one another, in the first semiconductor region between the two electrodes. Respective channel regions of the first semiconductor region are formed between the individual further semiconductor regions. The channel regions are directed perpendicularly to the two surfaces of the first semiconductor region (vertical channels). A vertical current flow between the two electrodes is passed through these channel regions and thereby limited by the channel regions. In order to control the current flow between the two electrodes, a gate voltage may be applied to the oppositely doped semiconductor regions in the first semiconductor region. The gate voltage enables the resistance of the channel regions to be controlled.

SUMMARY OF THE INVENTION

It is accordingly an object of the invention to provide a current limiting semiconductor configuration which overcomes the hereinafore-mentioned disadvantages of the heretofore-known devices of this general type, and which switches in electric currents and has current limiting capabilities in the event of an overcurrent condition.

With the foregoing and other objects in view there is provided, in accordance with the invention, a semiconductor configuration, including: a first semiconductor region having a predetermined conductivity type and a first surface; a contact region disposed on the first surface of the first semiconductor region; a second semiconductor region disposed within the first semiconductor region underneath the contact region and has a conductivity type opposite the predetermined conductivity type of the first semiconductor region, a p-n junction with a depletion zone is formed between the first semiconductor region and the second semiconductor region; and the second semiconductor region extends outward beyond the contact region in all directions parallel to the first surface of the first semiconductor region and forming at least one lateral channel region with a bottom in the first semiconductor region, the bottom of the at least one lateral channel region is bounded by the depletion zone of the p-n junction and, in an on state, the at least one lateral channel region conducts an electric current from the contact region or to the contact region.

The at least one lateral channel region is thus disposed laterally in the first semiconductor region and thereby has very good saturation behavior.

In accordance with an added feature of the invention, there is at least one third semiconductor region with a conductivity type opposite to the predetermined conductivity type of the first semiconductor region, a second p-n junction having a second depletion zone is therefore formed between the at least one third semiconductor region and the first semiconductor region, and the second depletion zone of the second p-n junction bounding the at least one lateral channel region on a side opposite to the second semiconductor region.

In accordance with an additional feature of the invention, there is a control electrode disposed on the at least one third semiconductor region for controlling an electrical resistance of the at least one lateral channel region by applying a control voltage to the control electrode.

In accordance with another feature of the invention, there is at least one Schottky contact disposed in the first semiconductor region which a third depletion zone with the first semiconductor region, the third depletion zone bounds the at least one lateral channel region on a side opposite to the second semiconductor region.

In accordance with yet another added feature of the invention, a control voltage is applied to the at least one Schottky contact for controlling the electrical resistance of the at least one lateral channel region. In this embodiment, the channel region is bounded by the depletion zone of the at least one Schottky contact on a side opposite to the second semiconductor region. A control voltage can be applied to the Schottky contact for the purpose of controlling the electrical resistance of the channel region.

In accordance with a concomitant feature of the invention, there is a first contact region and a second contact region, the first semiconductor region has a second surface and the second contact region is disposed on the second surface, the first contact region is disposed on the first surface, the second surface is disposed remote from the first surface, and including at least one further channel region formed in the first semiconductor region disposed between adjacent second semiconductor regions, the at least one further channel region runs essentially vertically with respect to the first surface of the first semiconductor region, and during the on state of the semiconductor configuration the electric current flows between the first contact region and the second contact region through the at least one further channel region.

Other features which are considered as characteristic for the invention are set forth in the appended claims.

Although the invention is illustrated and described herein as embodied in a current-limiting semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
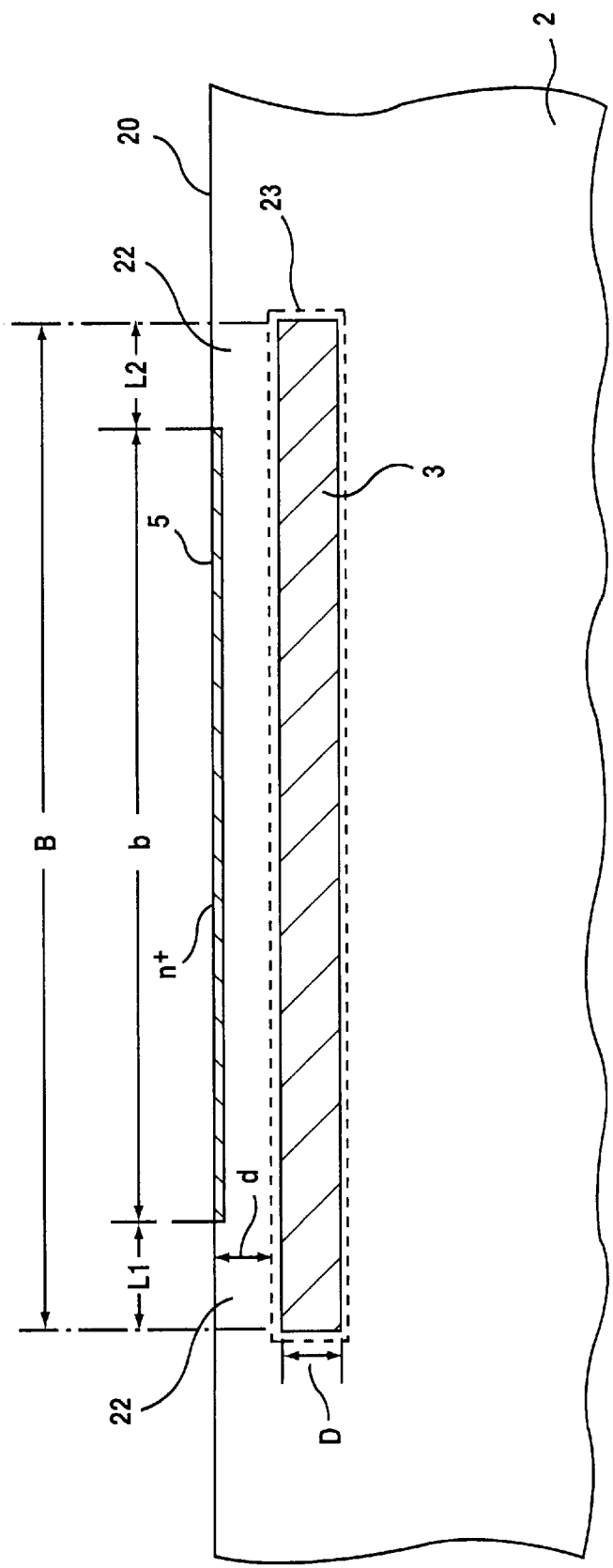
FIG. 1 is a diagrammatic, fragmentary, sectional view of a semiconductor configuration with a channel region bounded toward the bottom by a p-n junction.

Referring now to the figures of the drawing in detail and first, particularly, to FIG. 1 thereof, there is shown a semiconductor configuration having a first semiconductor region 2 of an n conductivity type and a second semiconductor region 3 of a p conductivity type. The first semiconductor region 2 has preferably a planar surface 20. The second semiconductor region 3 is disposed underneath the surface 20 within the first semiconductor region 2 and runs laterally at least on its side facing the surface 20 of the first semiconductor region 2. That is to say its essentially parallel to the surface 20 of the first semiconductor region 2. The second semiconductor region 3 is preferably produced by ion implantation of dopant particles into the surface 20 of the first semiconductor region 2. A desired doping profile is set by the penetration profile during ion implantation by the ion energy. The vertical extent D (that is to say measured perpendicularly to the surface 20 of the first semiconductor region 2) of the second semiconductor region 3 is not critical and results from the ion energies during ion implantation taking into account any implantation masks. A p-n junction is therefore formed between the first semiconductor region 2 and the oppositely doped second semiconductor region 3. A depletion zone (space charge zone) of the p-n junction is designated by 23. The depletion zone 23 of the p-n junction surrounds the entire second semiconductor region 3. The lateral extent of the second semiconductor region 3 parallel to the surface 20 of the first semiconductor region 2 is designated by B in FIG. 1. A contact region 5 is provided in the form of an ohmic contact on the surface 20 of the first semiconductor region 2. The ohmic contact region 5 is preferably a more heavily doped semiconductor region of the same conductivity type as the first semiconductor region 2, indicated by $n^+$ in the exemplary embodiment. An electric voltage can be applied to the contact region 5 with the aid of an unillustrated electrode. The lateral extent of the contact region 5 in the FIG. 1 is designated by b. The lateral extent b of the contact region 5 is smaller than the lateral extent B of the second semiconductor region 3 in all directions parallel to the surface 20 of the first semiconductor region 2. The second semiconductor region 3 and the contact region 5 are disposed relative to one another in such a way that when projected perpendicularly to the surface 20 of the first semiconductor region 2, the projection of the contact region 5 lies completely within the projection of the second semiconductor region 3.

Consequently, at least one channel region 22 is formed within the first semiconductor region 2 between an outer edge of the contact region 5 and an outer edge of the first semiconductor region 2. The lateral extents L1 and L2 of the channel region 22 may be identical or else have different magnitudes on different sides of the contact region 5. It is then true that L1+b+L2=B for the lateral extents L1, L2, b and B. The at least one channel region 22 is bounded toward the bottom, that is to say toward the side remote from the surface 20, by the space charge zone 23 of the p-n junction between the first semiconductor region and a second semiconductor region 3, and is bounded toward the top by the surface 20 of the first semiconductor region 2. When a voltage is applied between the contact region 5 and an unillustrated further contact region disposed on the surface 20 of the first semiconductor region 2 or on a further surface, remote from the first surface 20, of the first semiconductor region 2, the electric current between the two contact regions consequently flows through the at least channel region 22 in the first semiconductor region 2. By choosing the geometrical dimensions of the channel region 22, it is possible to set the electrical resistance and thus the current-carrying capacity of the channel region 22 and, consequently, to limit the electric current between the two contact regions in a desired manner. The vertical extent (that is to say the extent measured perpendicularly to the surface 20 of the first semiconductor region 2) of the channel region 22 is designated by d and is determined by the distance between the second semiconductor region 3 and the surface 20 of the first semiconductor region 2 and the extent of the depletion zone 23 of the p-n junction formed between the first semiconductor region 2 and the second semiconductor region 3. The extent of the space charge zone 23 of the p-n junction in this case depends on the charge carrier concentrations in the first semiconductor region 2 and the second semiconductor region 3 and on the reverse electric voltage present between these two semiconductor regions 2 and 3 (potential difference in the reverse direction of the p-n junction). Therefore, the electrical resistance in the channel region 22 can also be controlled by the potential of the second semiconductor region 3 being changed by application of a control voltage. The lateral extents L1 and L2 are defined, as already described, by the overlap of contact region 5 and second semiconductor region 3.

Figure 2:
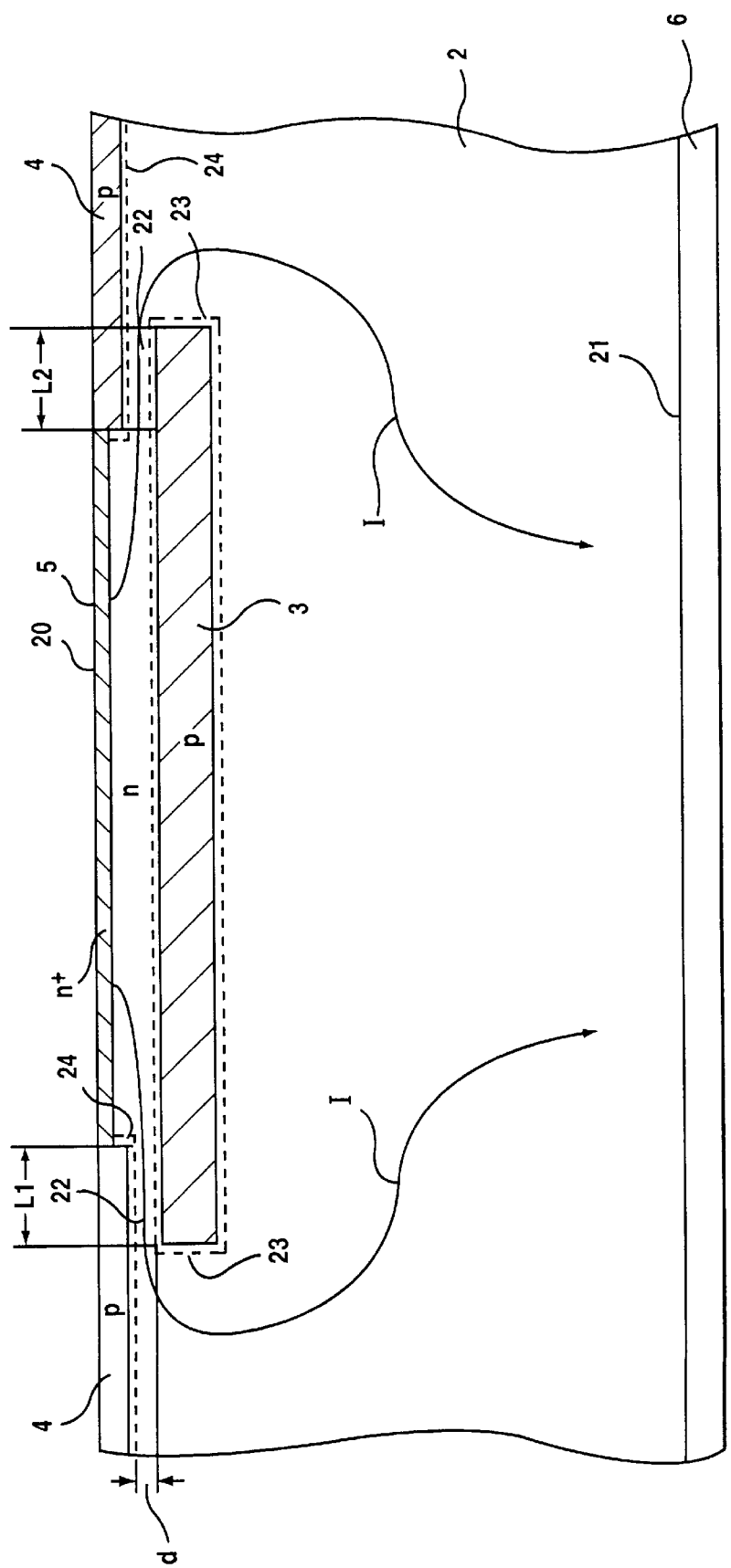
FIG. 2 is a fragmentary, sectional view of the semiconductor configuration with an additional p-n junction.

An additional option for setting the current-carrying capacity of the at least one channel region 22 is illustrated in FIG. 2. The semiconductor configuration according to FIG. 2 includes at least one third semiconductor region 4, which is p-doped and thus has a conductivity type opposite to the first semiconductor region 2 and adjoins the first semiconductor region 2. The third semiconductor region 4 is disposed laterally offset with respect to the first semiconductor region 3. That is to say, the third semiconductor region 4 is parallel to the surface 20 of the first semiconductor region 2, with the result that the two semiconductor regions 3 and 4 overlap along a length L1 on the left-hand side and a length L2 on the right-hand side when projected onto the surface 20 of the first semiconductor region 2. Consequently, the laterally extending channel region 22 is formed in the first semiconductor region 2 between the two p-doped semiconductor regions 3 and 4. The channel region 22 is bounded toward the bottom, as in FIG. 1, by the depletion zone 23 of the p-n junction formed between the first semiconductor region 2 and the second semiconductor region 3, and is now bounded toward the top by the depletion zone 24 of the p-n junction formed between the first semiconductor region 2 and the third semiconductor region 4. In this embodiment, the current flow I can additionally be influenced by setting the extent of the depletion zone 24 of the further p-n junction. The depletion zone 24 of the p-n junction formed between the first semiconductor region 2 and the third semiconductor region 4 depends on the charge carrier concentrations in the two semiconductor regions 2 and 4, the geometrical dimensions of the third semiconductor region 4 and, if appropriate, a voltage present across the p-n junction. In the embodiment illustrated, the contact region 5 directly adjoins the third semiconductor region 4, with the result that the lateral extents L1 and L2 of the channel region 22 correspond to the overlap of the two semiconductor regions 3 and 4 when projected orthogonally with respect to the surface 20. The contact region 5 and the third semiconductor region 4 may alternatively be spaced apart laterally from one another. The further contact region 6, for example an electrode, is disposed on a further surface 21 of the first semiconductor region 2. The further surface 21 is remote from the first surface 20. The operating voltage of the semiconductor configuration is applied between the first contact region 5 and the further contact region 6. In the embodiment illustrated, the contact region 5 is connected to the cathode and the contact region 6 is connected to the anode. In the event of interchanging the conductivity types of the semiconductor regions, the polarity of the operating voltage is likewise interchanged. The embodiments according to FIGS. 1 and 2 may be used as passive current limiters.

Figure 3:
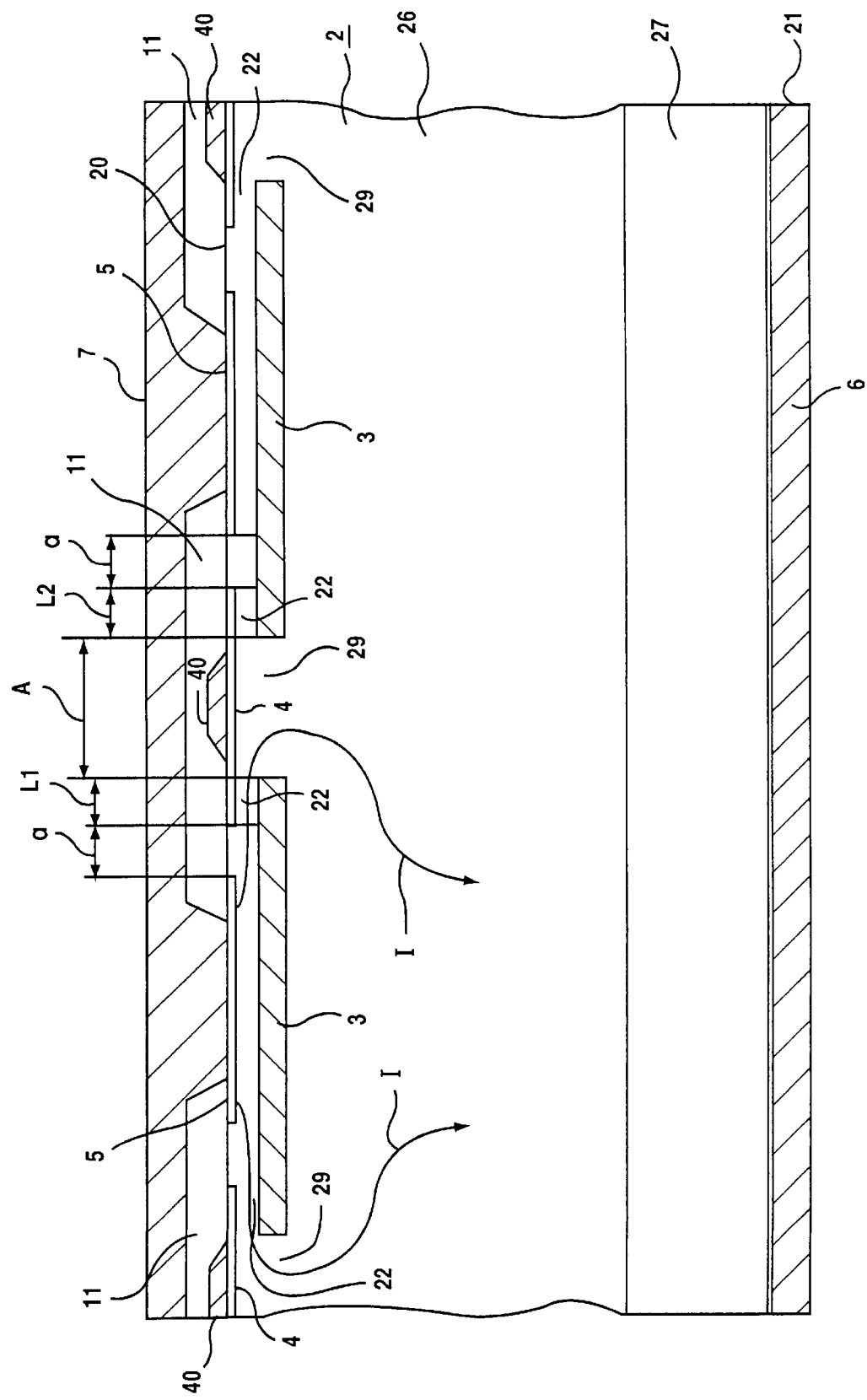
FIG. 3 is a fragmentary, sectional view of the semiconductor configuration with control electrodes.

FIG. 3 shows a third embodiment of the semiconductor configuration having controllable current limiting capabilities. A plurality of the contact regions 5 are disposed spaced apart from one another on the surface 20 of the first semiconductor region 2 (only two of which contact regions are illustrated). The contact regions 5 are assigned a common electrode 7. The second semiconductor region 3, which is doped oppositely to the first semiconductor region 2, is buried in the first semiconductor region 2 under the contact regions 5. The further semiconductor regions 4, which are each doped oppositely to the first semiconductor region 2, are disposed on the surface 20 of the first semiconductor region 2 at a respective lateral distance "a" between the contact regions 5. The semiconductor regions 3 and 4 each run essentially laterally with respect to the surface 20 of the first semiconductor region 2. When projected along a direction perpendicular to the surface 20, in each case, one semiconductor region 4 overlaps with two of the semiconductor regions 3 and each semiconductor region 3 overlaps with two of the semiconductor regions 4. The laterally running channel regions 22 are again formed in the first semiconductor region 2. The channel regions 22 are bounded toward the bottom and toward the top in each case by the depletion zone of a p-n junction, as was the case in the embodiment shown in FIG. 2. The lower p-n junctions are formed between the first semiconductor region 2 and the second semiconductor region 3. The upper p-junctions are formed between the first semiconductor region 2 and a respective semiconductor region 4. In the embodiment illustrated, the first semiconductor region 2 is formed by a substrate 27 and an epitaxially grown semiconductor layer 26 disposed thereon, which are of the same conductivity type. The electrode 6 is again disposed on that side of the substrate 27 which is remote from the semiconductor layer 26 as the further or second surface 21 of the first semiconductor region 2.

The operating voltage of the semiconductor configuration is applied between the electrode 6 and the common electrode 7. Formed in the second semiconductor region 3 are openings each having a lateral extent A, through which a respective channel region 29 of the first semiconductor region 2 runs essentially vertically with respect to the surface 20. Each channel region 29 is laterally bounded by the depletion zone (not illustrated) of the p-n junction formed by the first semiconductor region 2 and by the second semiconductor region 3. The lateral extent A of the openings in the second semiconductor region 3 is chosen such that the maximum reverse voltage that can be applied between the two contact regions 6 and 7 at least largely corresponds to the maximum bulk reverse voltage that can be carried by the p-n junction between the semiconductor regions 2 and 3 on the underside of the second semiconductor region 3. This corresponds to an at least largely planar profile of the equipotential lines in the reverse-biased case. Typical values for the lateral extent A of the openings in the second semiconductor region 3 lie between 1 $\mu$m and 10 $\mu$m. When a forward-biased operating voltage is applied, a current I flows between the electrode 7 and the electrode 6 along the path illustrated by the arrows, which current runs first of all through the lateral channel regions 22 and then, in a direction which is virtually vertical with respect to the surface 20, through the vertical channel regions 29 in the first semiconductor region 2. The current flow through the channel regions 22 can be controlled, and in particular limited, by controlling the potential of the semiconductor regions 4. For this purpose, the semiconductor regions 4 are assigned control electrodes 40, to which preferably the same control voltage is applied. The control electrodes 40 and the common electrode 7 are isolated by an insulation layer 11 applied by using a known buried gate technology. Such an embodiment according to FIG. 3 can be employed as an active current limiter.

Figure 4:
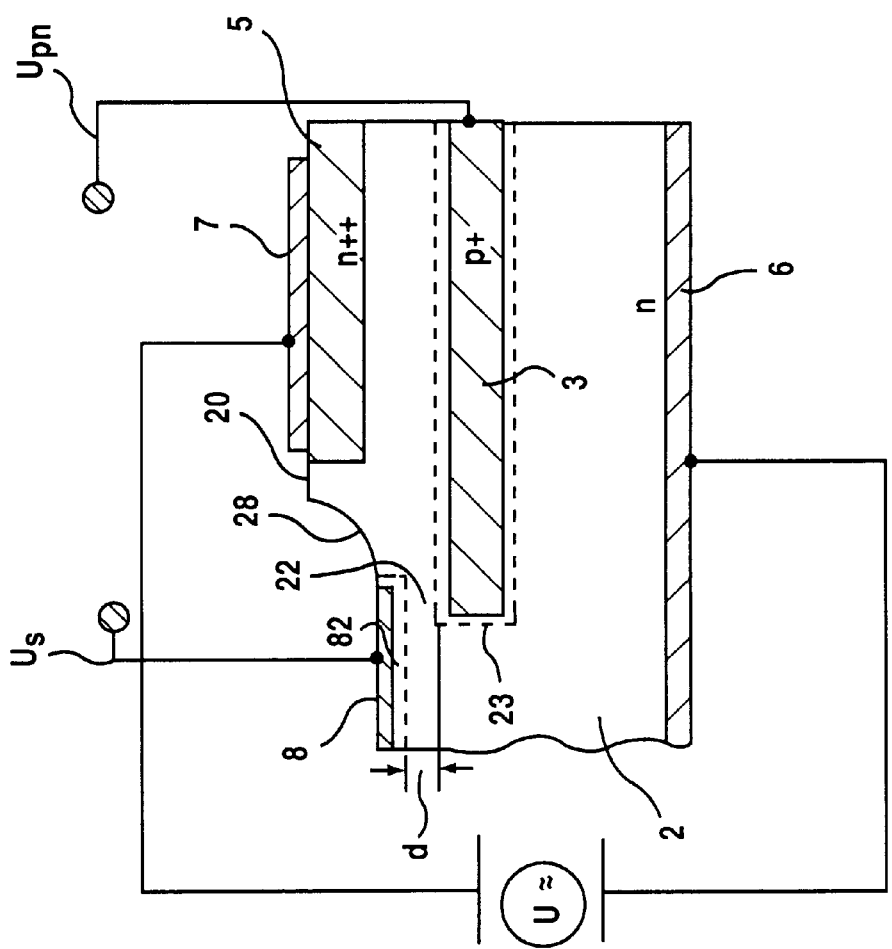
FIG. 4 is a fragmentary, sectional view of the semiconductor configuration with additional Schottky contacts.

FIG. 4 shows a fourth embodiment of the semiconductor configuration with controllable current limiting capabilities. In this embodiment, the channel region 22 within the first semiconductor region 2 is bounded toward the top by a depletion zone (depletion layer) 82 of a Schottky contact 8 and is bounded toward the bottom once again by the depletion zone 23 of the p-n junction between the first semiconductor region 2 and the buried semiconductor region 3. The Schottky contact 8 is preferably disposed on the surface 20 of the first semiconductor region 2. The extent of the depletion zone 82 of the Schottky contact 8 can be controlled by changing a Schottky control voltage $U_s$ applied to the Schottky contact. As a result, it is possible to control the vertical extent (depth) d of the channel region 22 and thus the current-carrying capacity thereof for a current flowing between the contact region 5 with the electrode 7 and the electrode 6. The operating voltage of the semiconductor configuration which is applied to the two electrodes 6 and 7 is designated by U and may be, in particular, an AC voltage. In the embodiment illustrated, the vertical extent d of the channel region 22 is additionally set by removing semiconductor material from the first semiconductor region 2, for example by an etching process. The Schottky contact 8 is disposed in a depression 28 produced by the removal of material and is thus downwardly offset with respect to the original surface of the first semiconductor region 2. Such a setting of the vertical extent d of the channel region 22 by producing depressions 28 or, in a complementary manner, by producing raised parts by additional material can also be performed in all the other embodiments.

All of the described embodiments of the semiconductor configuration can be constructed in different topologies, in particular in a cell construction having multilayer metallization or else in a comb-like structure.

We claim:

1. A current limiter, comprising:
   a first semiconductor region having a predetermined conductivity type, a first surface and a second surface remote from said first surface:
   a plurality of semiconductor configurations disposed adjacent one another within said first semiconductor region, each of said plurality of semiconductor configurations including:

a contact region disposed on said first surface of said first semiconductor region;

a second semiconductor region disposed within said first semiconductor region underneath said contact region and having an underside and a conductivity type opposite said predetermined conductivity type of said first semiconductor region; and a p-n junction with a depletion zone formed between said first semiconductor region and said second semiconductor region, said second semiconductor region extending outward beyond said contact region in all directions parallel to said first surface of said first semiconductor region and forming at least one lateral channel region with a bottom in said first semiconductor region, said bottom of said at least one lateral channel region bounded by said depletion zone of said p-n junction and, in an on state, said at least one lateral channel region conducting an electric current from or to said contact region;

a common first electrode electrically connected to each contact region of said plurality of semiconductor configurations; and a second electrode disposed on said second surface, said second semiconductor regions of adjacent semiconductor configurations defining openings therebetween, said openings forming further channel regions running essentially vertically with respect to said first surface and said openings having a lateral extent between 1 $\mu$m and 10 $\mu$m such that a maximum reverse voltage applied between said first electrode and said second electrode at least largely corresponds to a maximum bulk reverse voltage that can be carried by said p-n function on said underside of said second semiconductor regions of said plurality of semiconductor configurations.

2. The current limiter according to claim 1, wherein said p-n junction is a first p-n junction, each of said plurality of semiconductor configurations include at least one third semiconductor region with a conductivity type opposite to said predetermined conductivity type of said first semiconductor region and a second p-n junction having a second depletion zone formed between said at least one third semiconductor region and said first semiconductor region, said second depletion zone of said second p-n junction bounding said at least one lateral channel region on a side opposite to said second semiconductor region.

3. The current limiter according to claim 2, wherein each of said plurality of semiconductor configurations include a control electrode disposed on said at least one third semiconductor region for controlling an electrical resistance of said at least one lateral channel region by applying a control voltage to said control electrode.

4. The current limiter according to claim 1, wherein each of said plurality of semiconductor configurations include at least one Schottky contact disposed in said first semiconductor region and forming a third depletion zone with said first semiconductor region, said third depletion zone bounding said at least one lateral channel region on a side opposite to said second semiconductor region.

5. The current limiter according to claim 4, wherein a control voltage is applied to said at least one Schottky contact for controlling an electrical resistance of said at least one lateral channel region.

6. A current limiter, comprising:

a first semiconductor region having a predetermined conductivity type, a first surface and a second surface remote from said first surface;

a plurality of semiconductor configurations disposed adjacent one another within said first semiconductor region, each of said plurality of semiconductor configurations including:

a contact region disposed on said first surface of said first semiconductor region;

a second semiconductor region disposed within said first semiconductor region underneath said contact region and having an underside and a conductivity type opposite said predetermined conductivity type of said first semiconductor region; and a p-n junction with a depletion zone formed between said first semiconductor region and said second semiconductor region, said second semiconductor region extending outward beyond said contact region in all directions parallel to said first surface of said first semiconductor region;

a common first electrode electrically connected to each contact region of said plurality of semiconductor configurations; and a second electrode disposed on said second surface, said second semiconductor regions of adjacent semiconductor configurations defining openings therebetween, said openings forming channel regions running essentially vertically with respect to said first surface and said openings having a lateral extent between 1 $\mu$m and 10 $\mu$m such that a maximum reverse voltage applied between said first electrode and said second electrode at least largely corresponds to a maximum bulk reverse voltage that can be carried by said p-n junction on said underside of said second semiconductor regions of said plurality of semiconductor configurations.

7. The current limiter according to claim 6, wherein said p-n junction is a first p-n junction, each of said plurality of semiconductor configurations include at least one third semiconductor region with a conductivity type opposite to said predetermined conductivity type of said first semiconductor region and a second p-n junction having a second depletion zone formed between said at least one third semiconductor region and said first semiconductor region, said second depletion zone of said second p-n junction bounding said at least one lateral channel region on a side opposite to said second semiconductor region.

8. The current limiter according to claim 7, wherein each of said plurality of semiconductor configurations include a control electrode disposed on said at least one third semiconductor region for controlling an electrical resistance of said at least one lateral channel region by applying a control voltage to said control electrode.

9. The current limiter according to claim 6, wherein each of said plurality of semiconductor configurations include at least one Schottky contact disposed in said first semiconductor region and forming a third depletion zone with said first semiconductor region, said third depletion zone bounding said at least one lateral channel region on a side opposite to said second semiconductor region.

10. The current limiter according to claim 9, wherein a control voltage is applied to said at least one Schottky contact for controlling an electrical resistance of said at least one lateral channel region.

* * * * *